US010121743B2

United States Patent
Kamal et al.

(10) Patent No.: US 10,121,743 B2
(45) Date of Patent: Nov. 6, 2018

(54) POWER DISTRIBUTION NETWORKS FOR A THREE-DIMENSIONAL (3D) INTEGRATED CIRCUIT (IC) (3DIC)

(71) Applicant: QUALCOMM Incorporated, San Diego, CA (US)

(72) Inventors: Pratyush Kamal, San Diego, CA (US); Kambiz Samadi, San Diego, CA (US); Jing Xie, San Diego, CA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/472,614

(22) Filed: Mar. 29, 2017

(65) Prior Publication Data

US 2018/0286800 A1  Oct. 4, 2018

(51) Int. Cl.
*H01L 23/48* (2006.01)
*H01L 23/522* (2006.01)
(Continued)

(52) U.S. Cl.
CPC .......... *H01L 23/528* (2013.01); *H01L 23/481* (2013.01); *H01L 23/5226* (2013.01);
(Continued)

(58) Field of Classification Search
CPC .. H01L 23/481; H01L 23/528; H01L 23/5226
See application file for complete search history.

(56) References Cited

U.S. PATENT DOCUMENTS 9,142,553 B2  9/2015  Or-Bach et al.
9,293,437 B2  3/2016  Yu et al.
(Continued)

FOREIGN PATENT DOCUMENTS

WO  2016118262 A1  7/2016
WO  2016176046 A1  11/2016

OTHER PUBLICATIONS

Healy, Michael B. et al., "Power Delivery System Architecture for Many-Tier 3D Systems," 2010 Electronic Components and Technology Conference, Jun. 2010, IEEE, pp. 1682-1688.
(Continued)

*Primary Examiner* — David A Zarneke
(74) *Attorney, Agent, or Firm* — Withrow & Terranova, PLLC (57) ABSTRACT

Power distribution networks in a three-dimensional (3D) integrated circuit (IC) (3DIC) are disclosed. In one aspect, a voltage drop within a power distribution network in a 3DIC is reduced to reduce unnecessary power dissipation. In a first aspect, interconnect layers devoted to distribution of power within a given tier of the 3DIC are provided with an increased thickness such that a resistance of such interconnect layers is reduced relative to previously used interconnect layers and also reduced relative to other interconnect layers. Further voltage drop reductions may also be realized by placement of vias used to interconnect different tiers, and particularly, those vias used to interconnect the thickened interconnect layers devoted to the distribution of power. That is, the number, position, and/or arrangement of the vias may be controlled in the 3DIC to reduce the voltage drop.

16 Claims, 7 Drawing Sheets

(51) Int. Cl.
*H01L 23/528* (2006.01)
*H01L 27/06* (2006.01)
*H01L 25/065* (2006.01)

(52) U.S. Cl.
CPC ...... *H01L 25/0657* (2013.01); *H01L 27/0688* (2013.01); *H01L 2225/06544* (2013.01)

(56) References Cited

U.S. PATENT DOCUMENTS

| | | |
|---|---|---|
| 9,305,867 B1 | 4/2016 | Or-Bach et al. |
| 2012/0129301 A1 | 5/2012 | Or-Bach et al. |
| 2013/0037965 A1 | 2/2013 | Morimoto et al. |
| 2014/0091414 A1 | 4/2014 | Shimotsusa |
| 2015/0069570 A1 | 3/2015 | Shih |
| 2016/0322331 A1 | 11/2016 | Lim et al. |
| 2018/0166432 A1* | 6/2018 | Won ........................ G06F 17/50 |
| 2018/0204796 A1* | 7/2018 | Wang ................. H01L 23/5223 |

OTHER PUBLICATIONS

International Search Report and Written Opinion for PCT/US2018/016434, dated May 17, 2018, 15 pages.

* cited by examiner

POWER DISTRIBUTION NETWORKS FOR A THREE-DIMENSIONAL (3D) INTEGRATED CIRCUIT (IC) (3DIC)

BACKGROUND

I. Field of the Disclosure

The technology of the disclosure relates generally to power distribution within a three-dimensional (3D) integrated circuit (IC) (3DIC).

II. Background

Computing devices have become common throughout society. The increase in the number of computing devices is attributable, in part, to the increase in functionality and speed of such devices. While increases in functionality and speed have increased the utility of all computing devices, a concurrent decrease in the size of the circuits used in computing devices has helped increase the prevalence of mobile computing devices such as laptops, smart phones, tablets, and the like.

While Moore's Law suggests that it will be possible to improve manufacturing such that the number of transistors in a given area doubles every two years, the reality is that integrated circuits (ICs) using low nanometer scale technologies are apparently reaching some true physical limits and continued size reductions are increasingly difficult to achieve. To continue to increase transistor density, circuit designers have incorporated three-dimensional (3D) designs that stack tiers of ICs atop one another. The tiers may be part of a monolithic device or may be separate wafers stacked on top of each other.

The use of 3D designs creates its own design challenges. Computing devices may employ voltage supply sources for providing voltage to various components for operation. Rather than coupling voltage supply sources directly to the components, a power distribution system with one or more power distribution networks for distributing power may be used. 3D designs may likewise have such power distribution networks. As device size decreases, there has been a concurrent movement to reduce operating voltages. Even when operating voltages are not being reduced, efforts to improve battery performance in mobile computing devices have also placed pressure on designers to reduce power dissipation within power distribution networks.

SUMMARY OF THE DISCLOSURE

Aspects disclosed in the detailed description include power distribution networks for a three-dimensional (3D) integrated circuit (IC) (3DIC). Exemplary aspects involve reducing a voltage drop within a power distribution network in a 3DIC thereby reducing power dissipation. Reducing the voltage drop allows an operating voltage to be reduced while still achieving the same power levels for operating devices in the 3DIC and, for example, can extend battery performance for mobile computing devices. In a first exemplary aspect, interconnect layers (e.g., metal layers) devoted to distribution of power within a given tier of the 3DIC are provided with an increased thickness such that a resistance of such interconnect layers is reduced relative to previously used interconnect layers and also reduced relative to other interconnect layers. In a second exemplary aspect, further voltage drop reductions may also be realized by placement of vias used to interconnect different tiers, and particularly, those vias used to interconnect the thickened interconnect layers devoted to the distribution of power. That is, the number, position, and/or arrangement of the vias may be controlled in the 3DIC to reduce the voltage drop.

In this regard in one aspect, a 3DIC is disclosed. The 3DIC includes a first IC tier. The first IC tier includes an interface layer including a first face. The first IC tier also includes a first plurality of metal layers including a first top metal layer substantially adjacent to the first face and a first bottom metal layer spaced from the first face. A thickness of the first top metal layer is at least eight times greater than a thickness of the first bottom metal layer. The 3DIC also includes a second IC tier. The second IC tier includes a second interface layer including a second face positioned in a face-to-face arrangement with the first face. The second IC tier also includes a second plurality of metal layers including a second top metal layer substantially adjacent to the second face and a second bottom metal layer spaced from the second face. A thickness of the second top metal layer is at least eight times greater than a thickness of the second bottom metal layer.

In another aspect, a 3DIC is disclosed. The 3DIC includes a means for containing a first circuit. The means for containing the first circuit includes an interface layer including a first face. The means for containing the first circuit also includes a first plurality of metal layers including a first top metal layer substantially adjacent to the first face and a first bottom metal layer spaced from the first face. A thickness of the first top metal layer is at least eight times greater than a thickness of the first bottom metal layer. The 3DIC also includes a means for containing a second circuit. The means for containing the second circuit includes a second interface layer including a second face positioned in a face-to-face arrangement with the first face. The means for containing the second circuit also includes a second plurality of metal layers including a second top metal layer substantially adjacent to the second face and a second bottom metal layer spaced from the second face. A thickness of the second top metal layer is at least eight times greater than a thickness of the second bottom metal layer. The 3DIC also includes a means for electrically coupling the first top metal layer to the second top metal layer.

In another aspect, a 3DIC is disclosed. The 3DIC includes a first IC tier. The 3DIC also includes a second IC tier. The 3DIC also includes a power distribution path extending from the first IC tier to the second IC tier. The power distribution path includes a first top metal layer in the first IC tier and a second top metal layer in the second IC tier. The first top metal layer is at least three micrometers (3 μm) thick.

In another aspect, a 3DIC is disclosed. The 3DIC includes a first means for containing a first circuit on first IC tier. The 3DIC also includes a second means for containing a second circuit on a second IC tier. The 3DIC also includes a means for distributing power extending from the first IC tier to the second IC tier. The means for distributing power includes a first top metal layer in the first IC tier and a second top metal layer in the second IC tier. The first top metal layer is at least 3 μm thick.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include power distribution networks for a three-dimensional (3D) integrated circuit (IC) (3DIC). Exemplary aspects involve reducing a voltage drop within a power distribution network in a 3DIC thereby reducing power dissipation. Reducing the voltage drop allows an operating voltage to be reduced while still achieving the same power levels for operating devices in the 3DIC and, for example, can extend battery performance for mobile computing devices. In a first exemplary aspect, interconnect layers (e.g., metal layers) devoted to distribution of power within a given tier of the 3DIC are provided with an increased thickness such that a resistance of such interconnect layers is reduced relative to previously used interconnect layers and also reduced relative to other interconnect layers. In a second exemplary aspect, further voltage drop reductions may also be realized by placement of vias used to interconnect different tiers, and particularly, those vias used to interconnect the thickened interconnect layers devoted to the distribution of power. That is, the number, position, and/or arrangement of the vias may be controlled in the 3DIC to reduce the voltage drop.

Figure 1:
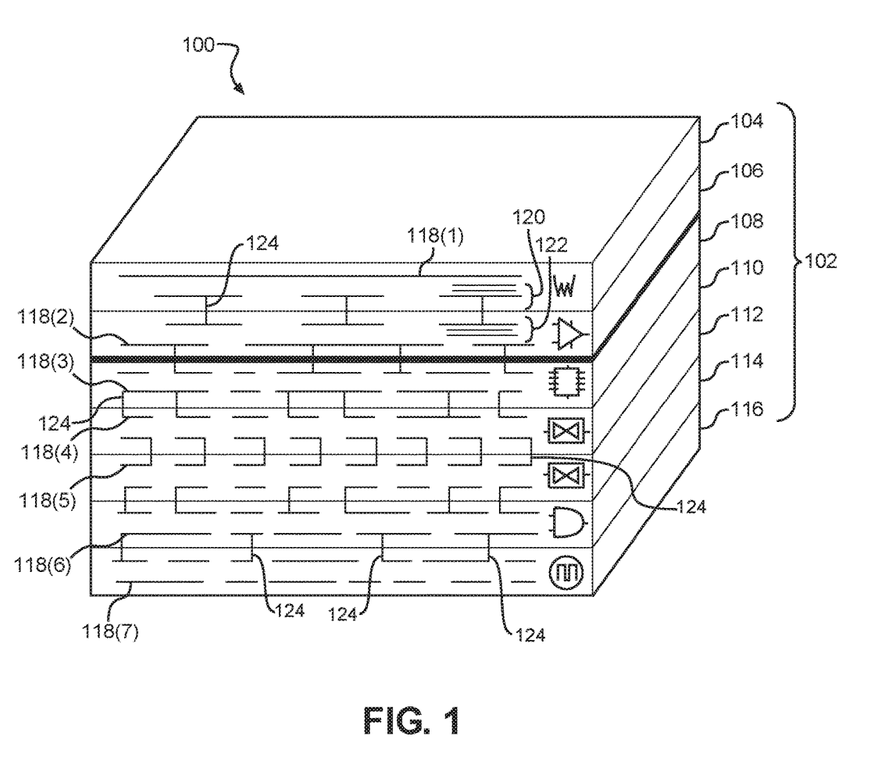
FIG. 1 is a simplified cross-sectional view of a three-dimensional (3D) integrated circuit (IC) (3DIC) that may incorporate a power distribution network across multiple tiers having thickened interconnect layers according to an exemplary aspect of the present disclosure.

In this regard, FIG. 1 is a simplified representation of a 3DIC 100. In contrast to a two-dimensional (2D) IC (2DIC) which has a single layer formed from a semiconductor substrate material (such as silicon or a silicon on insulator material) with active elements formed thereon, the 3DIC 100 has multiple tiers 102 each of which may have a semiconductor substrate (e.g., silicon) and an active layer with active elements such as transistors formed thereon. The tiers 102 may sometimes be referred to as IC tiers because a given tier may form a self-contained IC. The tiers 102 may be formed by hydrogen cutting or other monolithic tier formation method as examples. Alternatively, the tiers 102 may be separate wafers that are stacked on top of each other (e.g., as a system in a package (SIP)). The wafers may begin as 2DICs that are then stacked to form a 3DIC. Such wafers may be manufactured on a single sheet of substrate and then cut into dies to form individual ICs as is well understood.

The use of 3DIC technology allows different tiers of the tiers 102 within the 3DIC 100 to perform different functions and potentially provide all functions of a particular device in a single 3DIC 100 by providing different circuits within the different tiers. As such, each of the tiers 102 is a means for containing a circuit. While exemplary aspects contemplate that a complete circuit is formed on each of the tiers 102, the tiers 102 may instead contain a component or element of a device to form a circuit. In an exemplary aspect, the 3DIC 100 may include circuits to form a radio frequency (RF) transceiver and controller for a mobile computing device. Thus, a first tier 104 includes sensors and other large feature size elements.

With continued reference to FIG. 1, a second tier 106 may include RF, analog and/or power management IC (PMIC) components such as a receiver, transmitter, and/or duplexer/switch. The second tier 106 may be designed to be relatively low noise so that incoming RF analog signals are not distorted.

With continued reference to FIG. 1, a third tier 108 may have a modem or other controller. To accommodate the functions on the third tier 108, materials and design of the third tier 108 may be selected to promote a medium-speed architecture.

With continued reference to FIG. 1, fourth and fifth tiers 110 and 112 may be a memory bitcell array with random access memory (RAM) including dynamic RAM (DRAM), static RAM (SRAM), or the like. Both the fourth and the fifth tiers 110 and 112 may be designed to provide low-leakage circuitry to improve operation of the RAM.

With continued reference to FIG. 1, sixth and seventh tiers 114 and 116 may be general processing unit tiers. The sixth tier 114 may include a digital signal processor (DSP), such as baseband processor, using combination logic while the seventh tier 116 may include a DSP relying on sequential logic. Both the sixth and the seventh tiers 114 and 116 may be designed to support high speeds at the expense of having increased leakage current.

With continued reference to FIG. 1, each of the tiers 102 includes a respective active layer 118(1)-118(7) on which transistors or other active elements are formed over a substrate (not labeled specifically). Each of the tiers 102 also includes a plurality of metal layers. For example, the first tier 104 includes a first plurality of metal layers 120 and the second tier 106 includes a second plurality of metal layers 122. The first and the second pluralities of metal layers 120 and 122 allow for intratier electrical interconnections to be made between different active elements within the respective tier and may sometimes be referred to as interconnect layers. For intertier connections, vias 124 are provided. The vias 124 are sometimes referred to herein as a means for electrically intercoupling tiers and more particularly for intercoupling metal layers of different tiers. The vias 124 may be through silicon vias (TSV) or through oxide vias (TOV).

As a point of nomenclature, each tier of the tiers 102 has a "face." As used herein, the face of the tier is the side of the tier closest to the plurality of metal layers therein. Thus, the first tier 104 and the second tier 106 are in a face-to-face arrangement because the first and the second pluralities of metal layers 120 and 122 do not have an intervening layer of active elements. In contrast, the second tier 106 and the third tier 108 are in a face-to-back arrangement, and the third tier 108 and the fourth tier 110 are in a back-to-back arrangement.

Figure 2:
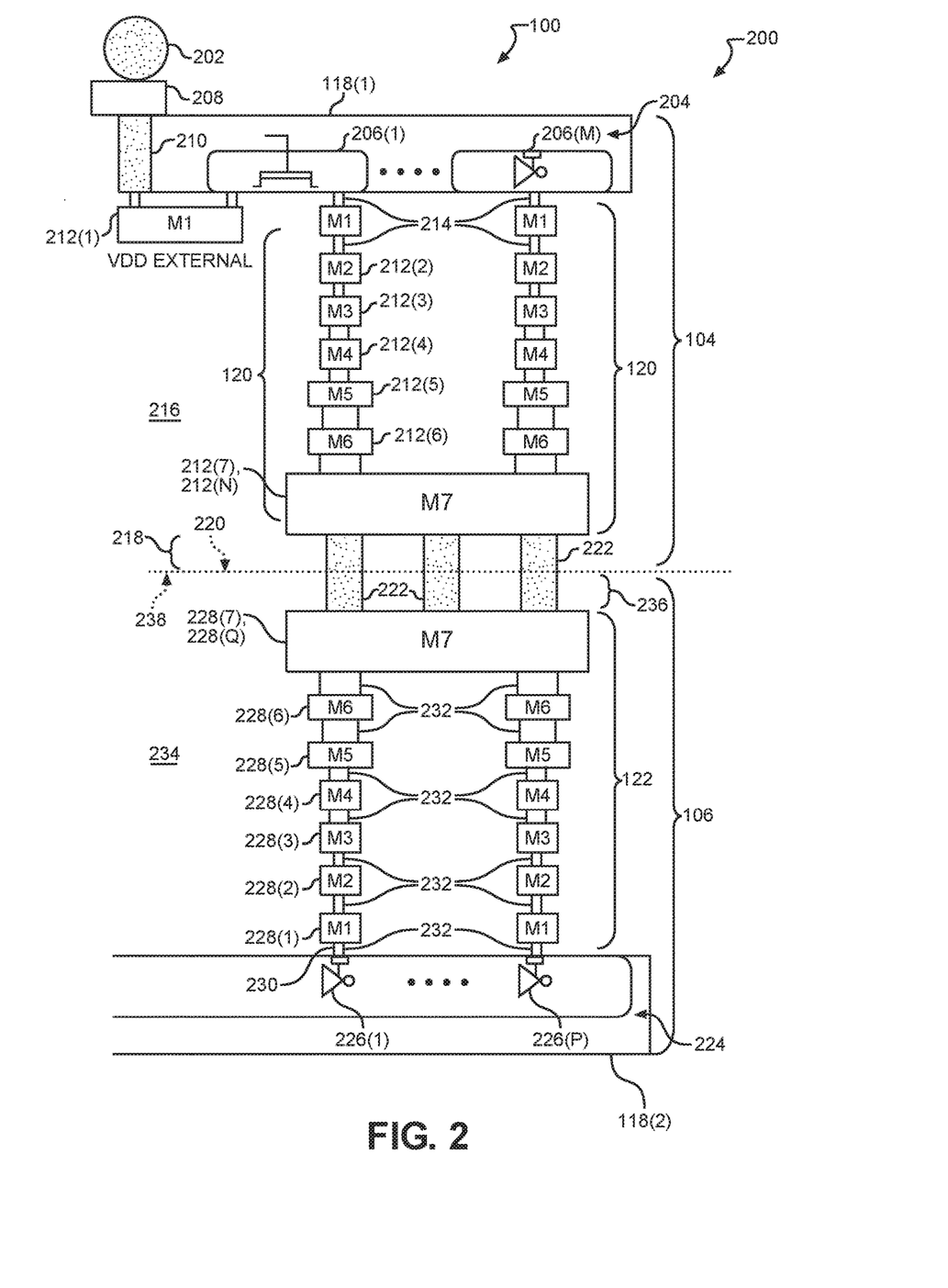
FIG. 2 is a cross-sectional view of two tiers of the 3DIC of FIG. 1 illustrating in more detail the interconnect layers therein arranged in a face-to-face arrangement and elements of the power distribution network.

A more detailed view of two of the tiers 102 is provided with reference to FIG. 2, where a portion 200 of the 3DIC 100 is illustrated. In particular, the first tier 104 and the second tier 106 are illustrated. The first tier 104 is configured to couple to a printed circuit board (not illustrated) within a computing device (also not illustrated) through a solder bump 202 or other connection conductor such as a pin. The solder bump 202 acts as a power input for the 3DIC 100. The first tier 104 has, as noted above, an active layer 118(1) which includes a substrate 204 with active elements 206(1)-206(M) formed thereon or therein. Power flows from the solder bump 202 through a contact 208 and through a via 210 to a bottom metal layer 212(1). The via 210 may be a through silicon via (TSV) or a through oxide via (TOV) or other vertical interconnect as is well understood. The bottom metal layer 212(1) (sometimes referred to as M1) may include a conductive trace which may electrically couple the via 210 to a first active element 206(1), which may be a power gating circuit or other element as needed or desired. The bottom metal layer 212(1) is part of the first plurality of metal layers 120, labeled 212(1)-212(N) in FIG. 2. As illustrated, N is seven (7). The bottom metal layer 212(1) has a first thickness. This thickness is sometimes referred to as Mz. An exemplary thickness is three tenths to five tenths of a micrometer (0.3-0.5 μm). Vias 214 or metal interconnects couple the first plurality of metal layers 212(1)-212(N). A dielectric material 216 fills the spaces between the first plurality of metal layers 212(1)-212(N). The first plurality of metal layers 212(1)-212(N) provide conductive paths to provide electrical connections between the active elements 206(1)-206(M) as is well understood.

With continued reference to FIG. 2, the first tier 104 includes an interface layer 218 having a face 220. The face 220 is substantially adjacent to a top metal layer 212(N). Intertier vias 222 extend from the top metal layer 212(N) to the second tier 106.

The present disclosure uses the term "interface layer." As used herein, an "interface layer" is the portion of a tier that is in contact with another tier. That is, the plane that forms the "interface" between the two tiers has an interface layer on either side thereof.

The present disclosure describes a "thickness." As thickness is a matter of perspective, and as used herein, "thickness" is relative to a plane parallel to the substrate 204 (or other substrate). That is, with the substrate 204 (or other substrate) as a starting reference point, the metal layers 212(1)-212(N) each have a length and width across a plane substantially equivalent to the substrate 204 and have a "vertical" dimension of a thickness. It should be appreciated that some 3DICs may be assembled horizontally rather than vertically, but the thickness is, again, relative to the plane formed by the substrate. The term thickness may sometimes be referred to as a "depth" to reiterate its connection to what is nominally the z-axis.

The present disclosure uses descriptive words like "top" and "bottom" to assist the reader in referencing particular elements. As used herein, "top" and "upper" are used with reference to the face of the tier. Thus, the top metal layer 212(N) is the uppermost metal layer and is on "top" of the other metal layers, even though, as illustrated, the entire tier 102 is inverted such that the face is beneath the back of the tier 102. Likewise, terms like "bottom" and "lower" are used with reference to the face of the tier. Thus, the bottom metal layer 212(1) is furthest removed from the face 220 and closest to the back of the tier 102.

As used herein, "substantially adjacent" means that there is no other layer between the between the face and the top metal layer (e.g., the top metal layer 212(N)). That is, there is no other metal layer that is closer to the face than the top metal layer, and there are no active elements (e.g., the active elements 206(1)-206(M)) between the face and the top metal layer. Likewise, while there may be a thin layer of dielectric and/or an oxide bonding layer, there is no structure between the top metal layer and the face except for the intertier vias. While the present disclosure contemplates that the top metal layer be substantially adjacent to the face, in other exemplary aspects, the top metal layer may be merely adjacent to the face so as to enable the features, such as the intertier vias 222, presented in the disclosure.

Returning to FIG. 2, the second tier 106 includes an active layer 118(2) which include a substrate 224 with active elements 226(1)-226(P) formed thereon or therein. The second tier 106 further includes the second plurality of metal layers 122, labeled 228(1)-228(Q) in FIG. 2. As illustrated, Q=N=7. A bottom metal layer 228(1) (sometimes referred to as M1) may include a conductive trace which may electrically couple a via 230 to a first active element 226(1). The bottom metal layer 228(1) is part of the second plurality of metal layers 228(1)-228(Q). The bottom metal layer 228(1) has a first thickness. This thickness is sometimes referred to as Mz. An exemplary thickness for the bottom metal layer 228(1) is 0.3-0.5 Vias 232 or metal interconnects couple the second plurality of metal layers 228(1)-228(Q). A dielectric material 234 fills the spaces between the second plurality of metal layers 228(1)-228(Q). The second plurality of metal layers 228(1)-228(Q) provide conductive paths to provide electrical connections between the active elements 226(1)-226(P) as is well understood.

With continued reference to FIG. 2, the second tier 106 includes a second interface layer 236 having a second face 238. The second face 238 is substantially adjacent to a top metal layer 228(Q). The intertier vias 222 extend from the top metal layer 212(N) to the top metal layer 228(Q).

A power distribution network is formed from the solder bump 202, through the contact 208, the via 210, the bottom metal layer 212(1), a power gating circuit that is the first active element 206(1), down through the vias 214 to the top metal layer 212(N). The top metal layer 212(N) is the primary metal layer for redistributing power to other active elements 206(2)-206(M) as well as to the next tier (i.e., the second tier 106). The power distribution network further includes at least some of the intertier vias 222 which carry the power to the second tier 106. The power is redistributed within the second tier 106 by the top metal layer 228(Q), and down through the vias 232 to the active elements 226(1)-226(P). While power may be distributed through the power distribution network through various specific routing or interconnection paths, it should be understood that a power distribution path exists between the solder bump 202 and an endpoint active element, whether that be one of the active elements 206(2)-206(M) or 226(1)-226(P). Likewise, while a power distribution path may exist from the solder bump 202 to an endpoint active element, a sub path may exist within a tier or from a first tier to a second tier. Such power distribution paths may be referred to herein as a means for distributing power. In a 3DIC, the power distribution network has to get power to active elements across multiple tiers, meaning that there is a relatively long resistive path from the power input to the active elements on the most distant tier. Voltage drop occurs along that resistive path.

While the length of the resistive path is mostly fixed, the resistance of particular segments can be changed to reduce the total voltage drop. Reductions in the voltage drop become increasingly important as device size shrinks and the area available to provide interconnections becomes more constrained.

Exemplary aspects of the present disclosure lower the voltage drop within the power distribution network by consolidating the power distribution onto the metal layers substantially adjacent to the face of the tiers. Thus, the top metal layers 212(N) and 228(Q) are the power distribution layers and are substantially adjacent to the respective faces 220 and 238. Further, the thickness associated with the top metal layers 212(N) and 228(Q) are thicker than the other metal layers 212(1)-212(N−1) and 228(1)-228(Q−1). In an exemplary aspect, the top metal layers 212(N) and 228(Q) are eight times thicker than the bottom metal layers 212(1) and 228(1) (e.g., three (3) μm). In further exemplary aspects, the top metal layers 212(N) and 228(Q) are eight to thirty-two times thicker than the bottom metal layers 212(1) and 228(1) and, more particularly, sixteen to thirty-two times thicker. Thicker metal layers have lower resistances than thin metal layers.

Figure 3:
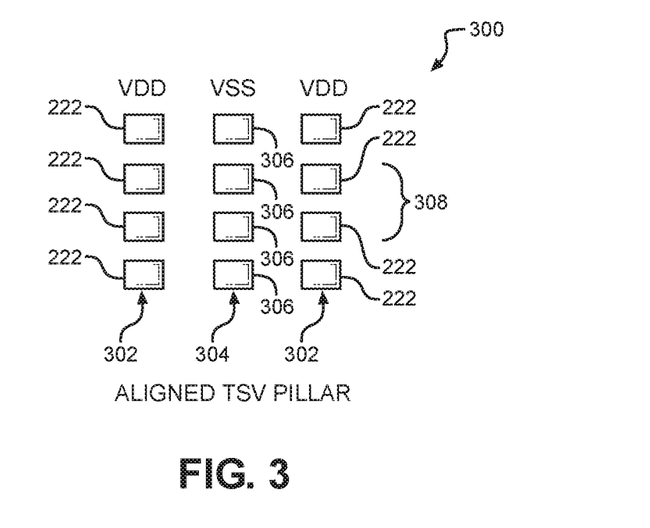
FIG. 3 is a simplified top elevational view of vias used to interconnect two tiers of the 3DIC of FIG. 1 according to an exemplary aspect of the present disclosure.

In addition to increasing the thickness of the top metal layers 212(N) and 228(Q), exemplary aspects of the present disclosure use TSV and TOV for the intertier vias 222. Still further, the arrangement of the intertier vias 222 may be manipulated to help reduce the voltage drop. A first manipulation is illustrated in FIG. 3 where the intertier vias 222 are arranged in an alternating pattern of clustered vias 300. The clustered vias 300 are arranged in rows 302 and 304. The vias in the rows 302 are the intertier vias 222 (e.g., Vdd). In between the rows 302 are the rows 304 of grounded vias 306 (e.g., Vss). As still a further improvement, within a given pitch 308, the vias 222 and 306 are staggered as shown in the pattern of clustered vias 400 illustrated in FIG. 4. That is, the intertier vias 222 are laterally displaced relative to the grounded vias 306.

Figure 4:
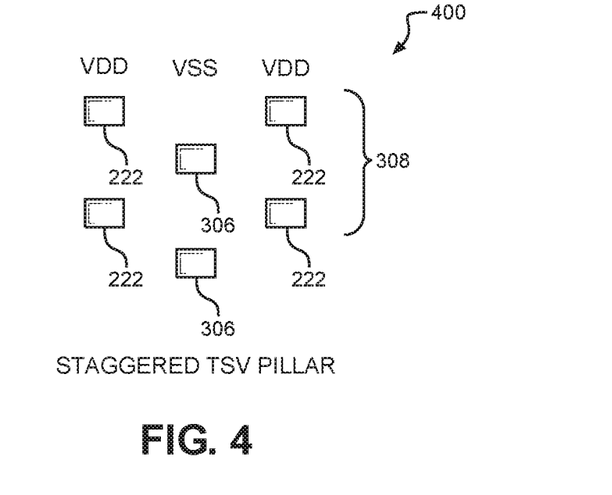
FIG. 4 is a simplified top elevational view of an alternate staggered arrangement of vias used to interconnect two tiers of the 3DIC of FIG. 1.

Given that the intertier vias 222 of FIGS. 3 and 4 are clustered, there are a few design options available when performing circuit layout designs. In particular, the via clusters may be a hard macro that is used by pick and routing software. Alternatively, the via clusters may be embedded in other macros used by the pick and routing software.

Figure 5:
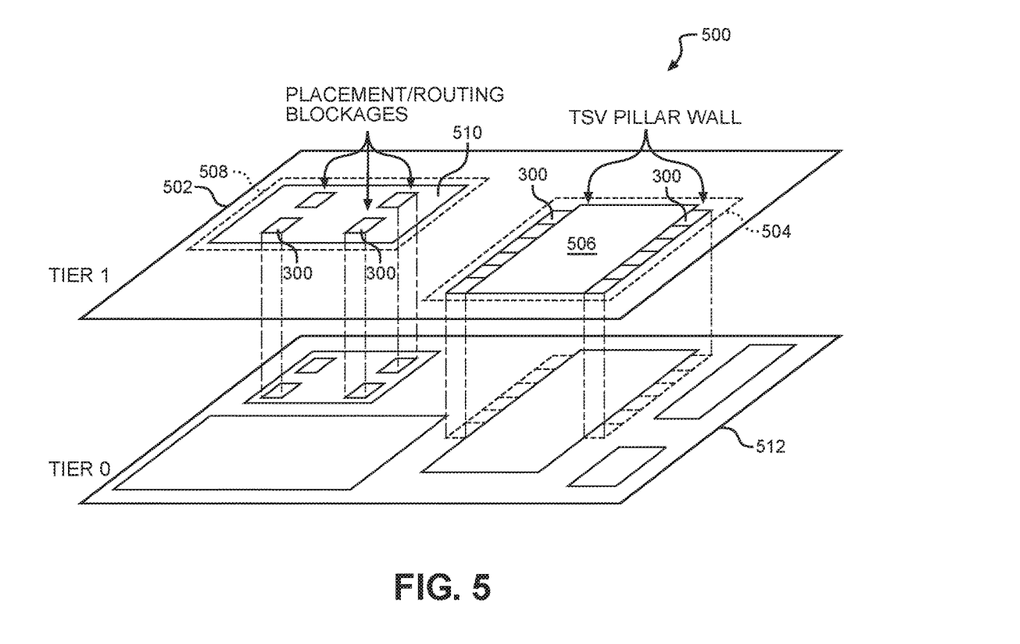
FIG. 5 illustrates a simplified block diagram of via placement design options according to an exemplary aspect of the present disclosure.

In this regard, FIG. 5 illustrates exemplary macros with via clusters within a tier of a 3DIC 500. In particular, the 3DIC 500 includes a first tier 502 with a first macro block 504 having the clustered vias 300 arranged in a wall around a logical circuit 506. It should be appreciated that the "wall" represents a general line of clustered vias 300. While two walls on opposite sides of the logical circuit 506 are illustrated, a single wall could also be used. Alternatively, the 3DIC 500 may include a second macro block 508 with the clustered vias 300 positioned inside a logical circuit 510. That is, the logical circuit 510 has a perimeter, and the clustered vias 300 are inwardly spaced from that perimeter. The clustered vias 300 have the intertier vias 222 therein that extend to a second tier 512. While not illustrated, it is also contemplated that one or more clusters of the clustered vias 300 may be positioned inside the perimeter, but adjacent thereto. However, in contrast to the "wall" described above, the clustered vias 300 may be present in insufficient numbers to form a wall. In still another contemplated aspect, both a wall and an interior positioning may be used within a single logical circuit.

Figure 6:
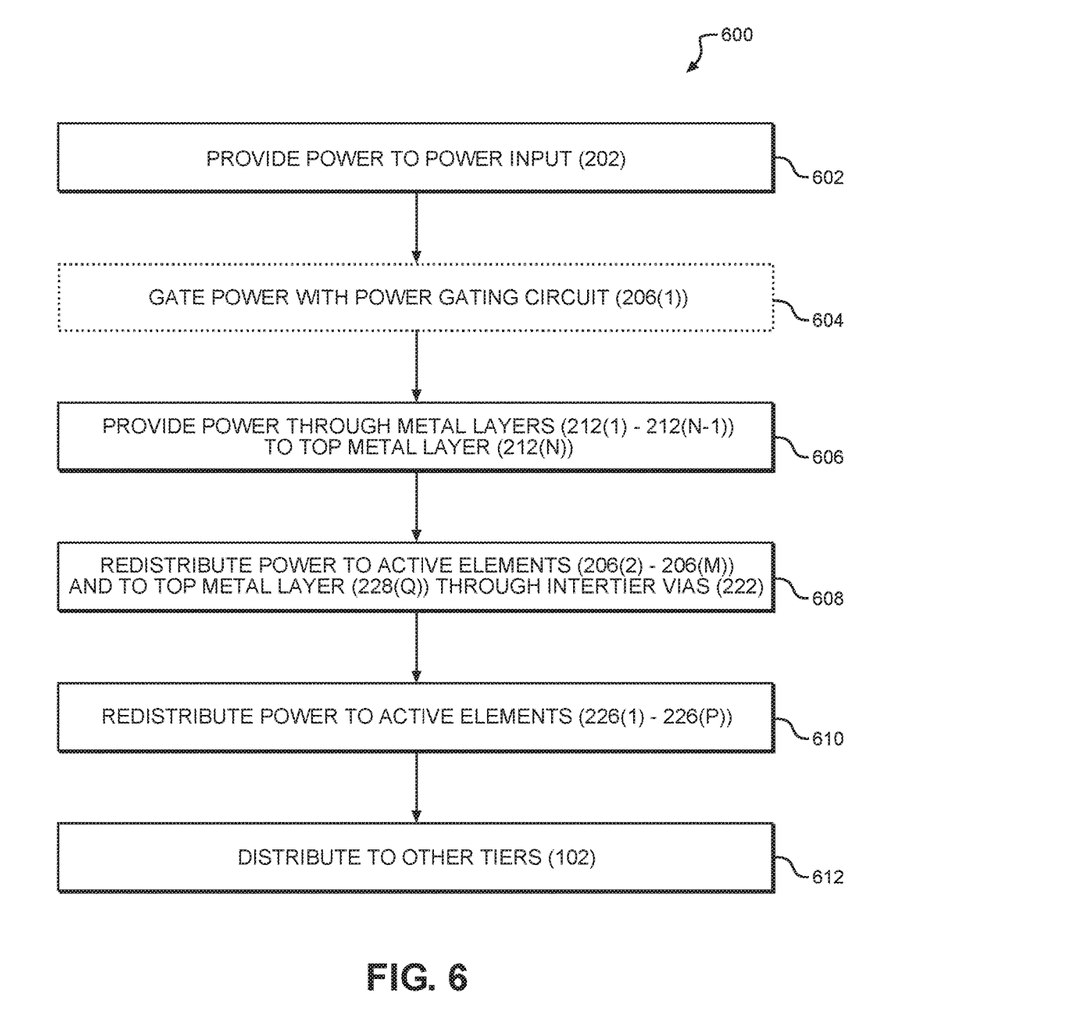
FIG. 6 is a flowchart illustrating an exemplary process for operating a 3DIC having a power distribution network according to the present disclosure.

An exemplary process 600 for operating the 3DIC 100 of FIG. 2 with the power distribution networks of the present disclosure is provided with reference to FIG. 6. The process 600 begins by providing power to the power input (e.g., solder bump 202) (block 602). Optionally, the power may be gated by a power gating circuit 206(1) (block 604). The power is then provided through the metal layers 212(1)-212(N−1) to the top metal layer 212(N) (block 606). The top metal layer 212(N) redistributes the power through low resistance metal and through the metal layers 212(1)-212(N−1) to the active elements 206(2)-206(M), and also delivers the power to the top metal layer 228(Q) through the intertier vias 222 (block 608). The top metal layer 228(Q) redistributes the power through the low resistance metal and then through the metal layers 228(1)-228(Q−1) to the active elements 226(1)-226(P) (block 610). If there are other tiers 102 in the 3DIC 100, the power is delivered thereto through additional top metal layers (block 612).

Figure 7:
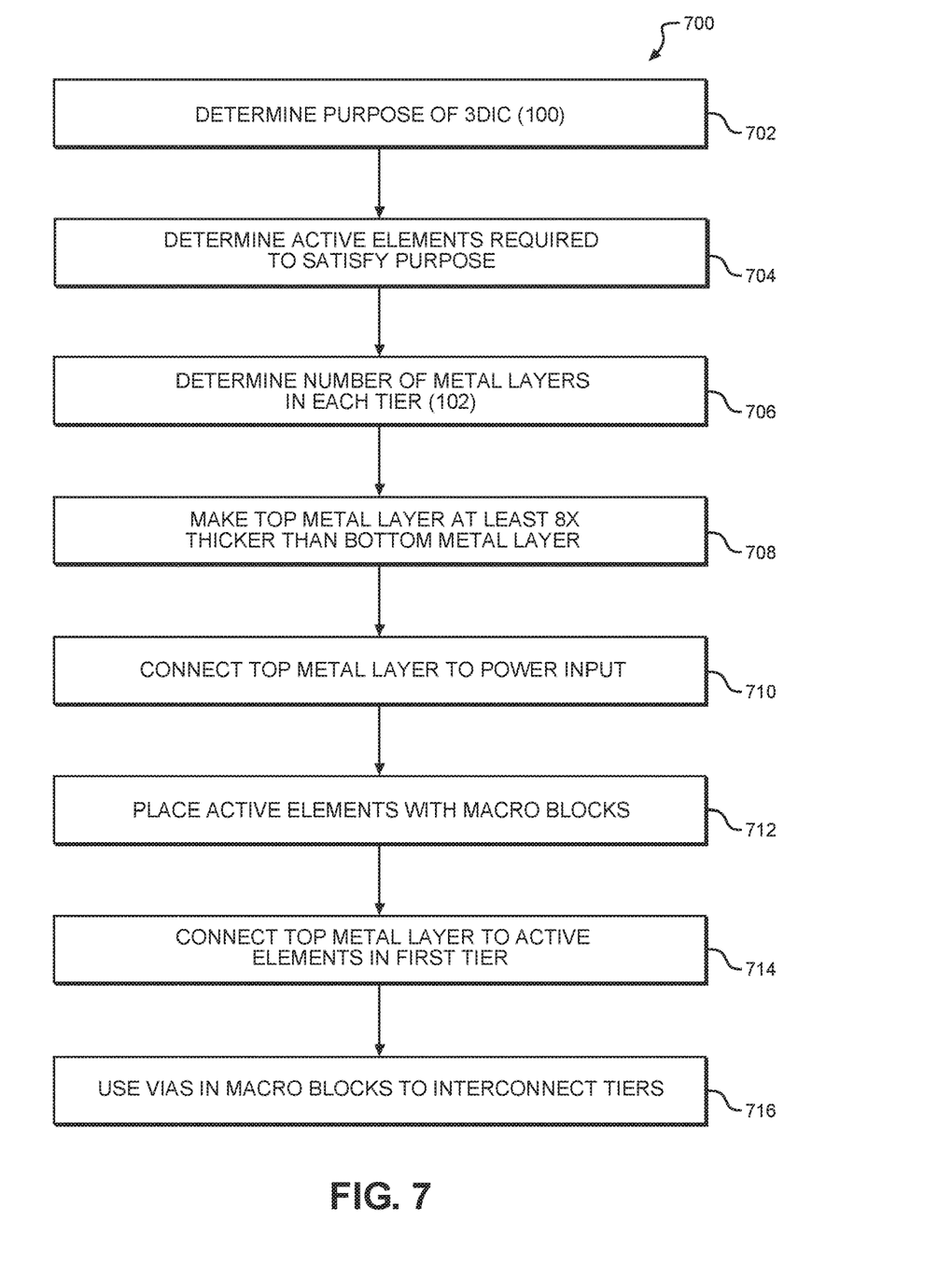
FIG. 7 is a flowchart illustrating an exemplary process for designing a circuit having a power distribution network according to the present disclosure.

A process 700 for designing the power distribution networks of the present disclosure is provided with reference to FIG. 7. The process 700 takes advantage of the macro blocks 504 and 508 described above in conjunction with the pick and route software. The process 700 begins by determining the purpose of the 3DIC 100 (block 702). For example, the 3DIC 100 may be a RF front-end (RFFE) circuit or a system on a chip (SoC) or the like. Once the purpose is determined, the designer determines what active elements are required to satisfy the purpose (block 704). The process 700 continues with the designer determining the number of metal layers in each tier 102 (block 706). The designer then makes the top metal layer in each tier at least eight times thicker than the bottom metal layer (block 708). The designer then connects the top metal layer to the power input (block 710) in the design. The designer then uses the pick and route software to place the active elements in the tiers using macro blocks where possible (block 712). The pick and route software then connects the top metal layer to the active elements in the first tier (block 714) in the design. The software then uses vias in the macro blocks to interconnect the tiers (block 716).

The power distribution networks for a 3DIC according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 8:
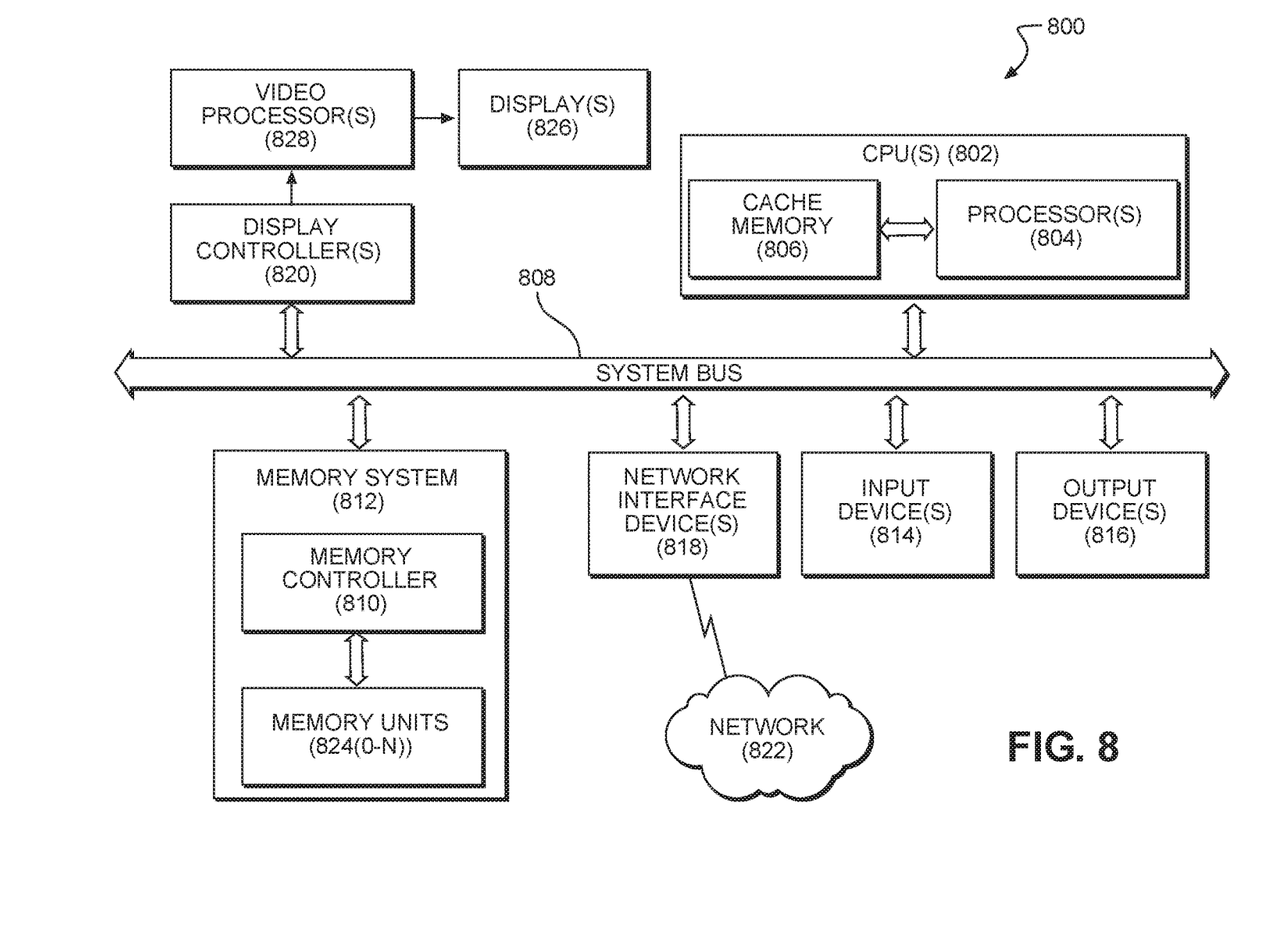
FIG. 8 is a block diagram of an exemplary processor-based system that can include the 3DIC of FIG. 1 having the power distribution network according to an exemplary aspect of the present disclosure.

In this regard, FIG. 8 illustrates an example of a processor-based system 800 that can employ the power distribution networks illustrated in FIGS. 1-5. In this example, the processor-based system 800 includes one or more central processing units (CPUs) 802, each including one or more processors 804. The CPU(s) 802 may have cache memory 806 coupled to the processor(s) 804 for rapid access to temporarily stored data. The CPU(s) 802 is coupled to a system bus 808 and can intercouple master and slave devices included in the processor-based system 800. As is well known, the CPU(s) 802 communicates with these other devices by exchanging address, control, and data information over the system bus 808. For example, the CPU(s) 802 can communicate bus transaction requests to a memory controller 810 as an example of a slave device. Although not illustrated in FIG. 8, multiple system buses 808 could be provided, wherein each system bus 808 constitutes a different fabric.

Other master and slave devices can be connected to the system bus 808. As illustrated in FIG. 8, these devices can include a memory system 812, one or more input devices 814, one or more output devices 816, one or more network interface devices 818, and one or more display controllers 820, as examples. The input device(s) 814 can include any type of input device, including, but not limited to, input keys, switches, voice processors, etc. The output device(s) 816 can include any type of output device, including, but not limited to, audio, video, other visual indicators, etc. The network interface device(s) 818 can be any devices configured to allow exchange of data to and from a network 822. The network 822 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 818 can be configured to support any type of communications protocol desired. The memory system 812 can include one or more memory units 824(0-N).

The CPU(s) 802 may also be configured to access the display controller(s) 820 over the system bus 808 to control information sent to one or more displays 826. The display controller(s) 820 sends information to the display(s) 826 to be displayed via one or more video processors 828, which process the information to be displayed into a format suitable for the display(s) 826. The display(s) 826 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a DSP, an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in RAM, flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A three-dimensional (3D) integrated circuit (IC) (3DIC), comprising:
   a first IC tier comprising:
      an interface layer comprising a first face; and
      a first plurality of metal layers comprising a first top metal layer substantially adjacent to the first face and a first bottom metal layer spaced from the first face, wherein a thickness of the first top metal layer is at least eight times greater than a thickness of the first bottom metal layer; and
   a second IC tier comprising:
      a second interface layer comprising a second face positioned in a face-to-face arrangement with the first face; and a second plurality of metal layers comprising a second top metal layer substantially adjacent to the second face and a second bottom metal layer spaced from the second face, wherein a thickness of the second top metal layer is at least eight times greater than a thickness of the second bottom metal layer.

2. The 3DIC of claim 1, wherein the thickness of the first top metal layer is sixteen times greater than the thickness of the first bottom metal layer.

3. The 3DIC of claim 1, wherein the thickness of the first top metal layer is thirty-two times greater than the thickness of the first bottom metal layer.

4. The 3DIC of claim 1, further comprising a via electrically coupling the first top metal layer to the second top metal layer.

5. The 3DIC of claim 4, wherein the via comprises a through silicon via (TSV).

6. The 3DIC of claim 4, wherein the via comprises a through oxide via (TOV).

7. The 3DIC of claim 1, wherein a plurality of vias electrically couple the first top metal layer to the second top metal layer.

8. The 3DIC of claim 7, wherein the plurality of vias form two via walls around a logical circuit in the first IC tier.

9. The 3DIC of claim 7, wherein at least one of the plurality of vias is positioned inside a logical circuit in the first IC tier.

10. The 3DIC of claim 7, wherein a first subset of the plurality of vias is configured to be coupled to a first reference voltage source and a second subset of the plurality of vias is configured to be coupled to a second reference voltage source.

11. The 3DIC of claim 10, wherein the plurality of vias are arranged in a plurality of rows where alternating rows are coupled to the first reference voltage source and the second reference voltage source, respectively.

12. The 3DIC of claim 11, wherein the alternating rows are staggered relative to one another.

13. The 3DIC of claim 1, wherein at least one of the first top metal layer and the second top metal layer comprises at least part of a power distribution path for the second IC tier.

14. The 3DIC of claim 13, wherein both of the first top metal layer and the second top metal layer comprise at least part of the power distribution path for the second IC tier.

15. A three-dimensional (3D) integrated circuit (IC) (3DIC) comprising:
a means for containing a first circuit comprising:
an interface layer comprising a first face; and
a first plurality of metal layers comprising a first top metal layer substantially adjacent to the first face and a first bottom metal layer spaced from the first face, wherein a thickness of the first top metal layer is at least eight times greater than a thickness of the first bottom metal layer;
a means for containing a second circuit comprising:
a second interface layer comprising a second face positioned in a face-to-face arrangement with the first face; and
a second plurality of metal layers comprising a second top metal layer substantially adjacent to the second face and a second bottom metal layer spaced from the second face, wherein a thickness of the second top metal layer is at least eight times greater than a thickness of the second bottom metal layer; and
a means for electrically coupling the first top metal layer to the second top metal layer.

16. The 3DIC of claim 15, wherein the means for electrically coupling the first top metal layer to the second top metal layer comprises a via.

* * * * *